US012764950B2

(12) United States Patent
Na et al.

(10) Patent No.: US 12,764,950 B2
(45) Date of Patent: Oct. 13, 2026

(54) SEMICONDUCTOR DEVICE AND METHOD OF MANUFACTURING SEMICONDUCTOR DEVICE

(71) Applicant: SK hynix Inc., Gyeonggi-do (KR)

(72) Inventors: Hee Do Na, Gyeonggi-do (KR); Hee Soo Kim, Gyeonggi-do (KR); Yoon Soo Oh, Gyeonggi-do (KR); Chang Soo Lee, Gyeonggi-do (KR); Chul Young Ham, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 268 days.

(21) Appl. No.: 18/545,675

(22) Filed: Dec. 19, 2023

(65) Prior Publication Data

US 2025/0081452 A1 Mar. 6, 2025

(30) Foreign Application Priority Data

Sep. 4, 2023 (KR) ........................ 10-2023-0116926

(51) Int. Cl.

| | |
|---|---|
| ***H10B 41/27*** | (2023.01) |
| ***H10B 43/27*** | (2023.01) |
| ***H10B 63/00*** | (2023.01) |

(52) U.S. Cl.
CPC ............. *H10B 41/27* (2023.02); *H10B 43/27* (2023.02); *H10B 63/34* (2023.02)

(58) Field of Classification Search
None
See application file for complete search history.

(56) References Cited

U.S. PATENT DOCUMENTS

| | | | | |
|---|---|---|---|---|
| 10,340,284 B2 * | 7/2019 | Kim | ........................ | H10B 43/10 |
| 2020/0203372 A1 * | 6/2020 | Lee | ........................ | H10B 41/10 |

FOREIGN PATENT DOCUMENTS

| | | |
|---|---|---|
| KR | 20200078768 A | 7/2020 |
| KR | 102373616 B1 | 3/2022 |

* cited by examiner

*Primary Examiner* — Anthony Ho
(74) *Attorney, Agent, or Firm* — IP&T GROUP LLP

(57) ABSTRACT

A semiconductor device may include a gate structure including insulating layers and conductive layers alternately stacked, a channel layer passing through the gate structure, an insulating core disposed in the channel layer, and a capping layer including a capping pattern disposed in the channel layer and a capping liner disposed between the capping pattern and the insulating core and extending between the channel layer and the capping pattern, wherein the capping liner and the capping pattern may include impurities having different concentrations.

13 Claims, 13 Drawing Sheets

SEMICONDUCTOR DEVICE AND METHOD OF MANUFACTURING SEMICONDUCTOR DEVICE

CROSS-REFERENCE TO RELATED APPLICATION

This application claims priority under 35 U.S.C. § 119 to Korean Patent Application No. 10-2023-0116926 filed on Sep. 4, 2023, which is incorporated herein by reference in its entirety.

BACKGROUND

1. Technical Field

Embodiments of the present disclosure relate generally to semiconductor technology, and more particularly, to a three-dimensional semiconductor device and a method of manufacturing the semiconductor device.

2. Related Art

An integration degree of a semiconductor device is mainly determined by an area occupied by a unit memory cell. Recently, as improvements in an integration degree of a semiconductor device in which a memory cell is formed as a single layer on a substrate reaches a limit, a three-dimensional semiconductor device in which memory cells are stacked on a substrate is being proposed. In addition, various structures and manufacturing methods are being developed to improve operation reliability of the semiconductor device.

SUMMARY

According to an embodiment of the present disclosure, a three-dimensional semiconductor device (hereinafter referred to also as simply a semiconductor device) is provided which includes a gate structure including a stack of insulating layers and conductive layers alternately stacked, a channel layer passing through the gate structure, an insulating core disposed in a space defined by the channel layer, and a capping layer including a capping pattern disposed in a space defined by the channel layer and a capping liner disposed between the capping pattern and the insulating core and extending between the channel layer and the capping pattern, and the capping liner and the capping pattern may include impurities having different concentrations.

According to an embodiment of the present disclosure, a semiconductor device may include a gate structure including insulating layers and conductive layers alternately stacked, a channel layer passing through the gate structure, an insulating core disposed in the channel layer, and a capping layer including a capping pattern disposed in the channel layer, and a capping liner disposed between the capping pattern and the insulating core and extending between the channel layer and the capping pattern, and the capping liner and the capping pattern may have different grain sizes.

According to an embodiment of the present disclosure, a semiconductor device may include a gate structure including insulating layers and conductive layers alternately stacked, a channel layer passing through the gate structure, an insulating core disposed in the channel layer, a capping layer disposed on the channel layer and the insulating core, and a void disposed in the capping layer and exposing the insulating core.

According to an embodiment of the present disclosure, a method of manufacturing a semiconductor device may include forming a stack including first material layers and second material layers alternately stacked, forming a first opening in the stack, forming a preliminary channel layer in the first opening, forming a preliminary insulating core in the preliminary channel layer, forming a second opening by etching the preliminary insulating core, forming a preliminary capping liner in the second opening, partially etching the preliminary capping liner, and forming a preliminary capping pattern including an impurity of a concentration different from that of the preliminary capping liner, in the second opening.

According to an embodiment of the present disclosure, a method of manufacturing a semiconductor device may include forming a stack including first material layers and second material layers alternately stacked, forming a first opening in the stack, forming a preliminary channel layer in the first opening, forming a preliminary insulating core on the preliminary channel layer, forming a second opening by etching the preliminary insulating core, expanding the second opening by etching the preliminary channel layer, and forming a preliminary capping layer in the second opening through an epitaxial method and a deposition method.

These and other features and advantages of the present invention will become apparent from the detailed description in conjunction with the following drawings.

DETAILED DESCRIPTION

An embodiment of the present disclosure provides an improved semiconductor device having a stable structure and improved characteristics. An embodiment of the present disclosure provides also a method for manufacturing the semiconductor device.

According to embodiments of the present disclosure, a semiconductor device having a stable structure and improved characteristics may be provided.

Hereinafter, embodiments according to the technical concepts of the present disclosure are described with reference to the accompanying drawings.

Figure 1:
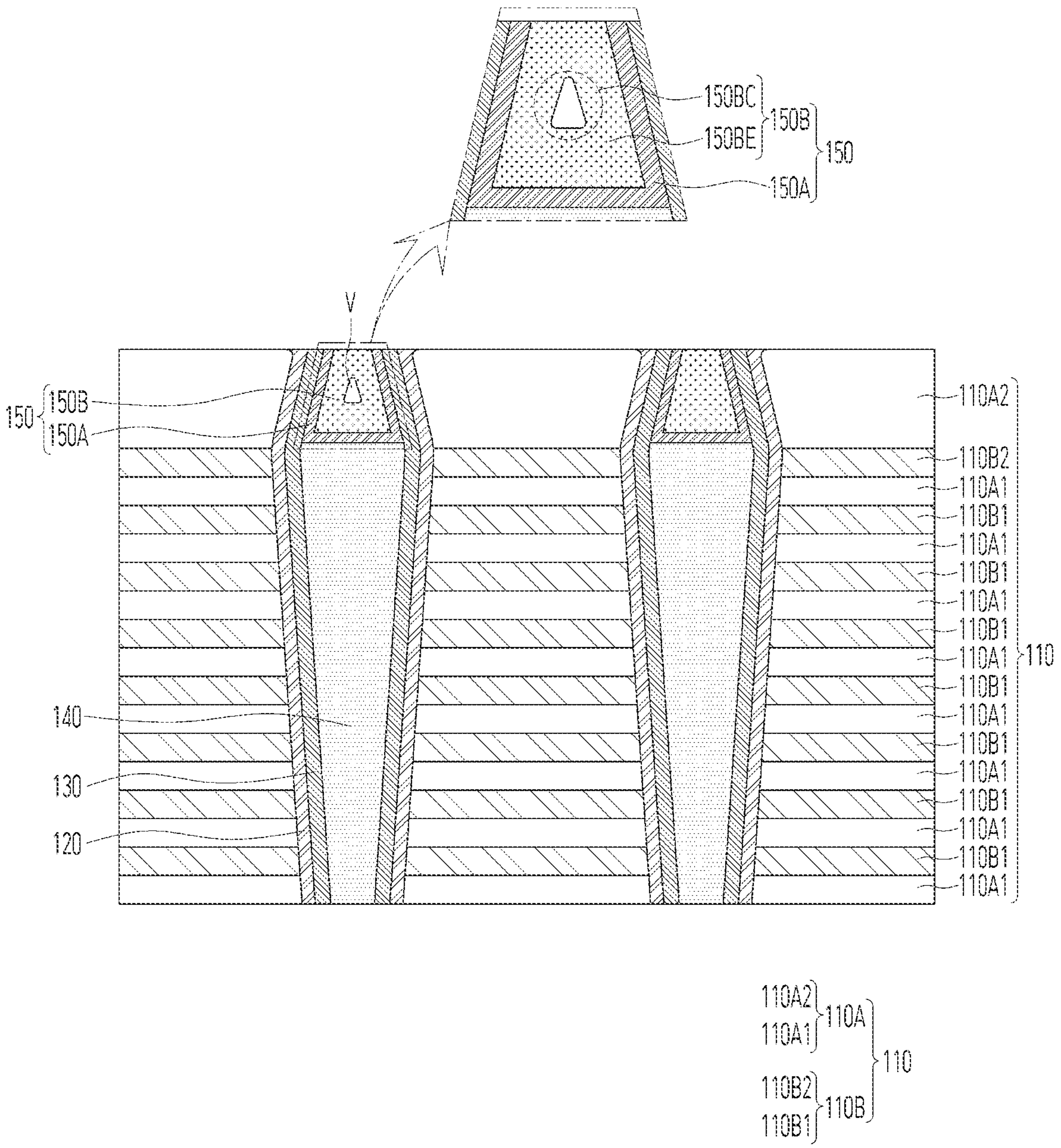
FIG. 1 is a simplified schematic diagram illustrating a semiconductor device according to an embodiment of the present disclosure.

FIG. 1 is a simplified schematic diagram illustrating a semiconductor device according to an embodiment of the present disclosure.

Referring to FIG. 1, the semiconductor device may include a gate structure 110 (also referred to as a gate stack), a memory layer 120, a channel layer 130, an insulating core 140, or a capping layer structure 150, or may include a combination thereof.

The gate structure 110 comprises a stack of insulating layers 110A and conductive layers 110B alternately stacked. The insulating layers 110A and the conductive layers 110B may have substantially the same or different thicknesses. A thickness of an insulating layer 110A2 disposed at the uppermost portion of the insulating layers 110A may be greater than that of remaining insulating layers 110A1. The insulating layers 110A may include an insulating material such as oxide. The conductive layers 110B may include a conducting material such as tungsten or polysilicon. The top conductive layer is indicated as 110B2 and the remaining conductive layers are indicated as 110B1. All the conductive layers 110B (110B1 and 110B2) may all have the same thickness.

The channel layer 130 may have a uniform width or different widths according to a level. For example, the channel layer 130 may have a cross-section of a tapered shape, and a lower surface may have a width narrower than that of an upper surface. For example, the shape of the channel layer 130 may have a cross-section of a bowing shape. In this case, the shape of the channel layer 130 may have a width, which is greater than that of the upper surface and the lower surface of the channel layer 130, at an intermediate level disposed between the upper surface and the lower surface of the channel layer 130. For example, the shape of the channel layer 130 may have a maximum width near a boundary of the uppermost insulating layer 110A2 and an uppermost conductive layer 110B2 among the conductive layers 110B. The channel layer 130 may include a semiconductor material such as polysilicon.

The memory layer 120 may surround the channel layer 130. The memory layer 120 may be formed along a sidewall of the channel layer 130. The memory layer 120 may be configured as a single layer or multiple layers. For example, the memory layer 120 may be multiple layers in which a blocking layer, a data storage layer, and a tunneling layer are stacked. Here, the blocking layer or the tunneling layer may include oxide, and the data storage layer may include a floating gate, a nitride layer, a variable resistance layer, or the like.

The insulating core 140 may be disposed in the channel layer 130. The insulating core 140 may have a tapered shape of which a width is reduced toward a lower portion. An upper surface of the insulating core 140 may be disposed at a level corresponding to a vicinity of the boundary between the uppermost insulating layer 110A2 and the uppermost conductive layer 110B2. The insulating core 140 may or may not include a void V. For example, the insulating core 140 may not include the void. The insulating core 140 may include an insulating material such as oxide.

The capping layer structure 150 may include a capping liner 150A and a capping pattern 150B. The capping pattern 150B may be disposed inside the capping liner 150A. The capping liner 150A may be disposed between the capping pattern 150B and the insulating core 140. The capping liner 150A may extend between the channel layer 130 and the capping pattern 150B. The capping liner 150A or the capping pattern 150B may have a tapered shape of which a width is reduced toward an upper portion. The capping layer structure 150 may include a semiconductor material such as polysilicon.

During a process of forming the capping layer structure 150, a void V may be formed in the capping layer structure 150. When the void V is formed, a conductive material may be formed in the void V in a subsequent process. When the conductive material is formed in the void V, a resistance of the capping layer structure 150 used as a drain region may change. Accordingly, a resistance difference between the capping layer structures 150 may occur. A limitation in which an operation of transistors connected to each cell string is non-uniform exists because the resistance difference between the capping layer structures 150 included in the cell strings occurs. Therefore, it would be beneficial to prevent the formation of the void V in the capping layer structure 150 or at least reduce the size of the void V.

The capping liner 150A may have a thickness substantially equal to that of the capping pattern 150B or may have a thickness different from that of the capping pattern 150B. For example, the capping liner 150A may have a relatively less thickness compared to the capping pattern 150B. The capping liner 150A may be formed through a process of depositing the capping liner 150A at least once and a process of etching the capping liner 150A at least once to prevent an overhang from being formed during a process of forming the capping liner 150A. Accordingly, the capping liner 150A may have a relatively less thickness compared to the capping pattern 150B. However, embodiments of the present disclosure are not limited thereto, and according to a manufacturing method, the capping liner 150A may have a thickness relatively greater than that of the capping pattern 150B.

The capping liner 150A and the capping pattern 150B may include impurities of different concentrations. The capping liner 150A may include an impurity of a first concentration, and the capping pattern 150B may include an impurity of a second concentration less than the first concentration. Here, the impurity may include phosphorus. A roughness of a structure surface may be different according to a concentration of an impurity. For example, the capping pattern 150B having a relatively low concentration of impurity may have a relatively less roughness compared to the capping liner 150A. Accordingly, the void V may be prevented or reduced from being formed in the capping pattern 150B by the relatively less roughness.

The capping pattern 150B may include a center portion 150BC and an edge portion 150BE surrounding the center portion 150BC. The capping pattern 150B may include or may not include the void V. For example, the center portion 150BC may include the void V. The center portion 150BC and the edge portion 150BE may include impurities of different concentrations. The concentration of the impurity may decrease from the edge portion 150BE to the center portion 150BC. For example, the impurity concentration of the center portion 150BC may be less than that of the edge portion 150BE. At least one of the edge portion 150BE and the center portion 150BC may have a concentration gradient of an impurity, and the concentration may decrease toward a center of the center portion 150BC. When the concentration of the impurity decreases, the roughness of the surface may decrease, and thus the size of the void V may be decreased. Accordingly, the center portion 150BC may include a void V of a relatively less size compared to a case where the center portion 150BC and the edge portion 150BE are formed at the same concentration.

The capping liner 150A and the capping pattern 150B may include the same impurity or different impurities. The capping liner 150A may include a first impurity, and the capping pattern 150B may include a second impurity. As an example, the first impurity and the second impurity may include phosphorus. As another example, the first impurity may include phosphorus and the second impurity may include carbon. When the capping liner 150A and the capping pattern 150B include different impurities, the capping liner 150A and the capping pattern 150B may have a different surface roughness. Accordingly, the capping liner 150A and the capping pattern 150B may have different grain sizes. In an embodiment, the capping liner 150A may include phosphorus, and the capping pattern 150B may include carbon. In this case, the capping liner 150A may have a first grain size, and the capping pattern 150B may have a second grain size less than the first grain size. Because the capping pattern 150B has a relatively less grain size, the size of the void V may be reduced substantially. For reference, the grain size may refer to the average crystal size of polysilicon including impurities. For example, the first grain size may refer to the average crystal size of polysilicon including phosphorus in the capping liner 150A. Also, the second grain size may refer to the average crystal size of polysilicon including carbon in the capping pattern 150B.

For reference, the capping liner 150A and the capping pattern 150B may be one layer or separate layers formed through separate processes. Accordingly, an interface may exist or may not exist between the capping liner 150A and the capping pattern 150B. In addition, a structure including the channel layer 130, the memory layer 120, the insulating core 140, and the capping layer structure 150 may be defined as a channel structure. Accordingly, the channel structure may have a bowing shape and may have a maximum width near the boundary between the uppermost insulating layer 110A2 and the uppermost conductive layer 110B2.

According to an embodiment of the present disclosure, a structure in which the capping layer structure 150 of a channel structure includes the capping liner 150A and the capping pattern 150B is described, but this is only for convenience of description and the embodiments of the present disclosure are not limited thereto. The capping layer structure 150 may be applied to a structure including polysilicon, such as a contact plug.

According to the structure described above, the capping liner 150A may have a relatively less thickness compared to the capping pattern 150B. Alternatively, the capping pattern 150B may have an impurity of a relatively less concentration compared to the capping liner 150A. Alternatively, the concentration of the impurity may be decreased from the edge portion 150BE to the center portion 150BC in the capping pattern 150B. In this case, formation of the void V may be prevented in the capping pattern 150B, or the size of the void V may be reduced substantially. Accordingly, operation of the cell strings may be improved.

The capping liner 150A may include phosphorus, and the capping pattern 150B may include carbon. Accordingly, the capping pattern 150B may have a relatively less grain size compared to the capping liner 150A. Therefore, the void V may be prevented from forming in the capping pattern 150B, or the size of the void V may be reduced substantially.

Figure 2:
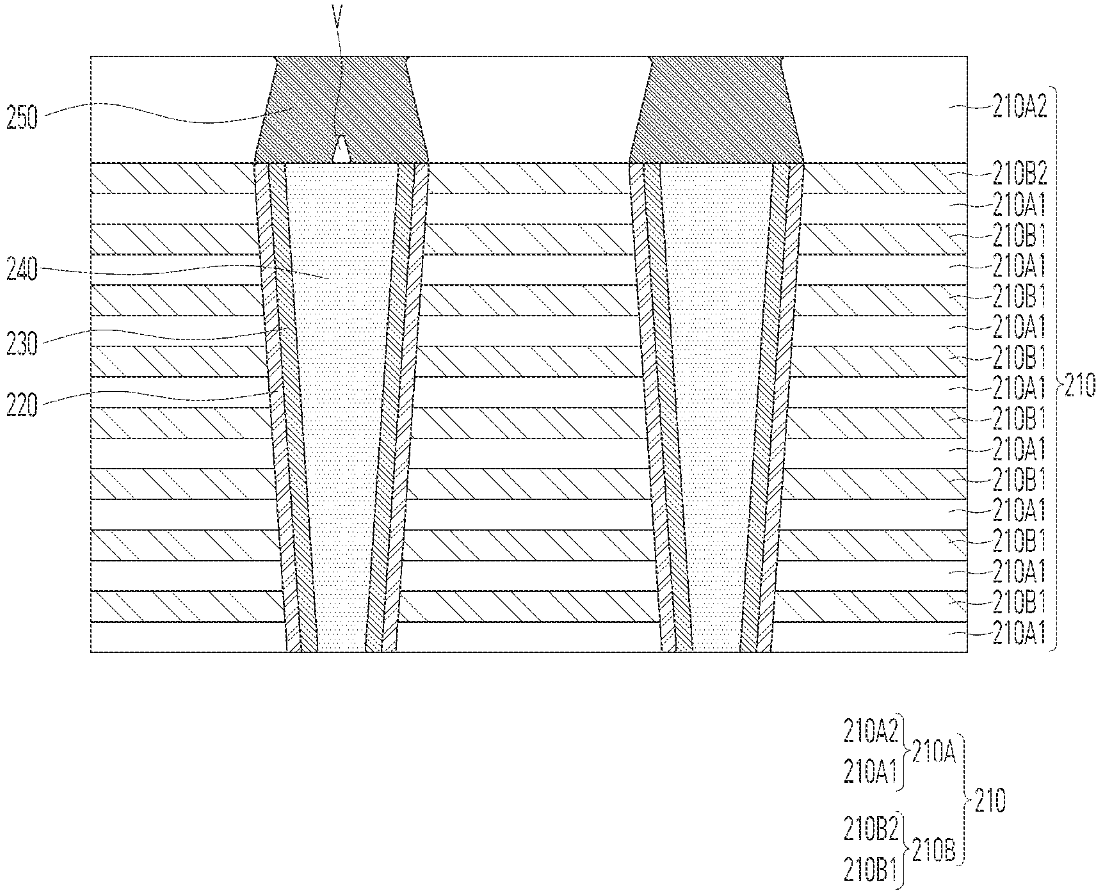
FIG. 2 is a simplified schematic diagram illustrating a semiconductor device according to an embodiment of the present disclosure.

FIG. 2 is a simplified schematic diagram illustrating a semiconductor device according to an embodiment of the present disclosure. Hereinafter, content overlapping the content described above is omitted.

Referring to FIG. 2, the semiconductor device may include a gate structure 210, a memory layer 220, a channel layer 230, an insulating core 240, or a capping layer 250, or may include a combination thereof.

The gate structure 210 may include insulating layers 210A and conductive layers 210B alternately stacked. The insulating layers 210A may include an insulating material such as oxide, and the conductive layers 210B may include a conductive material such as tungsten or polysilicon.

The channel layer 230 may extend through the gate structure 210. The channel layer 230 may have a uniform width or may have different widths. The channel layer 230 may have a cross-section of a tapered shape. The channel layer 230 may include a semiconductor material such as polysilicon.

The memory layer 220 may surround the channel layer 230. The memory layer 220 may be formed along a sidewall of the channel layer 230. Accordingly, the memory layer 220 may have a cross-section of a tapered shape. The memory layer 220 may be configured as a single layer or multiple layers. For example, the memory layer 220 may be multiple layers in which a blocking layer, a data storage layer, and a tunneling layer are stacked. Here, the blocking layer or the tunneling layer may include oxide, and the data storage layer may include a floating gate, a nitride layer, a variable resistance layer, or the like.

The insulating core 240 may be disposed in the channel layer 230. An upper surface of the insulating core 240 may be disposed at a level corresponding to an upper surface of the channel layer 230 or an upper surface of the memory layer 220. The insulating core 240 may have a cross-section of a tapered shape of which a width is reduced toward a lower portion. The insulating core 240 may include an insulating material such as oxide.

The capping layer 250 may be disposed on the top surface of the insulating core 240 and, also, on the top surfaces of the channel layer 230 and memory layers 220. The capping layer 250 may have a tapered shape. For example, the capping layer 250 may have a tapered shape of which a width is reduced toward an upper portion.

The capping layer 250 may include an epitaxial pattern and a deposition pattern. For example, the capping layer 250 may include the epitaxial pattern formed by growing silicon in an epitaxial method from the channel layer 230. In addition, the capping layer 250 may include the deposition pattern in which silicon is deposited on an uppermost insulating layer 210A2. The epitaxial pattern and the deposition pattern may change to polysilicon through heat treatment in a subsequent process. The epitaxial pattern and the deposition pattern may be one layer or separate layers formed through separate processes. Accordingly, an interface may or may not exist in the epitaxial pattern and the deposition pattern.

The capping layer 250 may or may not include the void V. For example, the capping layer 250 may include the void V. Here, the void V may expose at least one of the channel layer 230, the memory layer 220, and the insulating core 240. For example, the void V may expose the insulating core 240. Due to a process characteristic, when the capping layer 250 is formed using an epitaxial method, the void V may be formed on a lower surface of the capping layer 250. Therefore, a conductive material may be prevented from flowing through the void V in a subsequent process.

For reference, a structure including the channel layer 230, the memory layer 220, the insulating core 240, and the capping layer 250 may be defined as a channel structure. Accordingly, the channel structure may have a bowing shape and may have a maximum width near a boundary between an uppermost insulating layer 210A2 and an uppermost conductive layer 210B2.

According to the structure described above, the capping layer 250 may include the epitaxial pattern. Due to the process characteristic, a speed of forming the capping layer 250 in an epitaxial method may be higher than a speed of forming the capping layer 250 in a deposition method. Namely, a portion grown in the epitaxial method may be formed faster than a deposited portion. Accordingly, even though the void V is formed in the capping layer 250, because the void V is disposed on a lower surface of the capping layer 250, a conductive material may be prevented from flowing through the void V.

FIGS. 3A to 3G are simplified schematic diagrams illustrating a method of manufacturing a semiconductor device according to an embodiment of the present disclosure. Hereinafter, a content overlapping with the content described above is omitted.

Figure 3A:
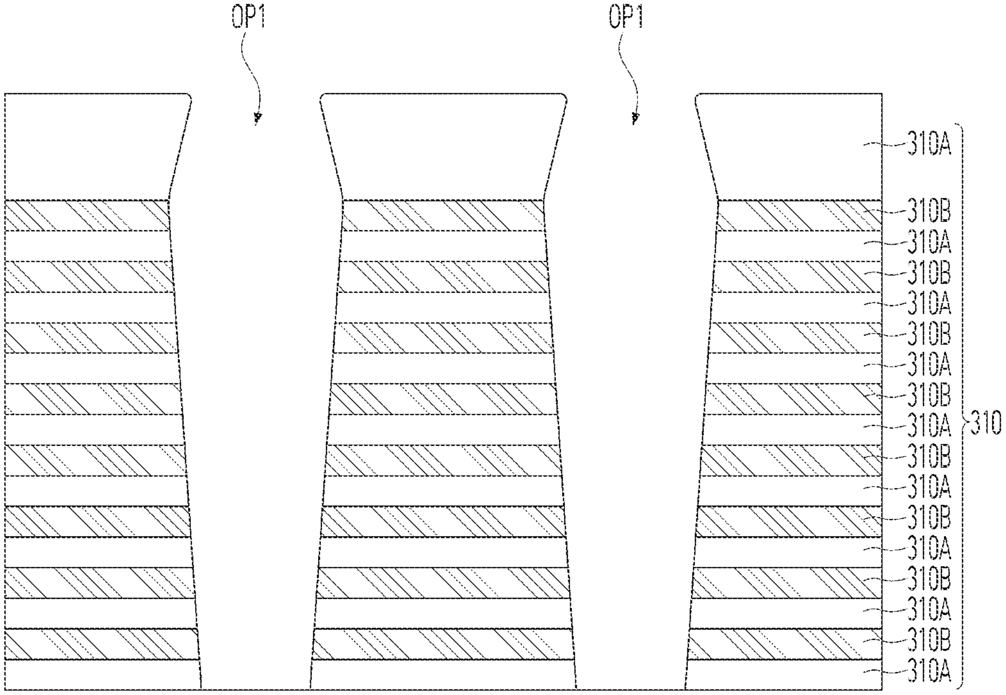
FIGS. 3A to 3G are simplified schematic diagrams illustrating a method of manufacturing a semiconductor device according to an embodiment of the present disclosure.

Referring to FIG. 3A, a stack 310 may be formed by alternately stacking first material layers 310A and second material layers 310B. The first material layers 310A may include an insulating material such as oxide. The second material layers 310B may include a sacrificial material such as nitride. Subsequently, a first opening OP1 may be formed in the stack 310. The first opening OP1 may have a cross-section of a bowing shape.

Figure 3B:
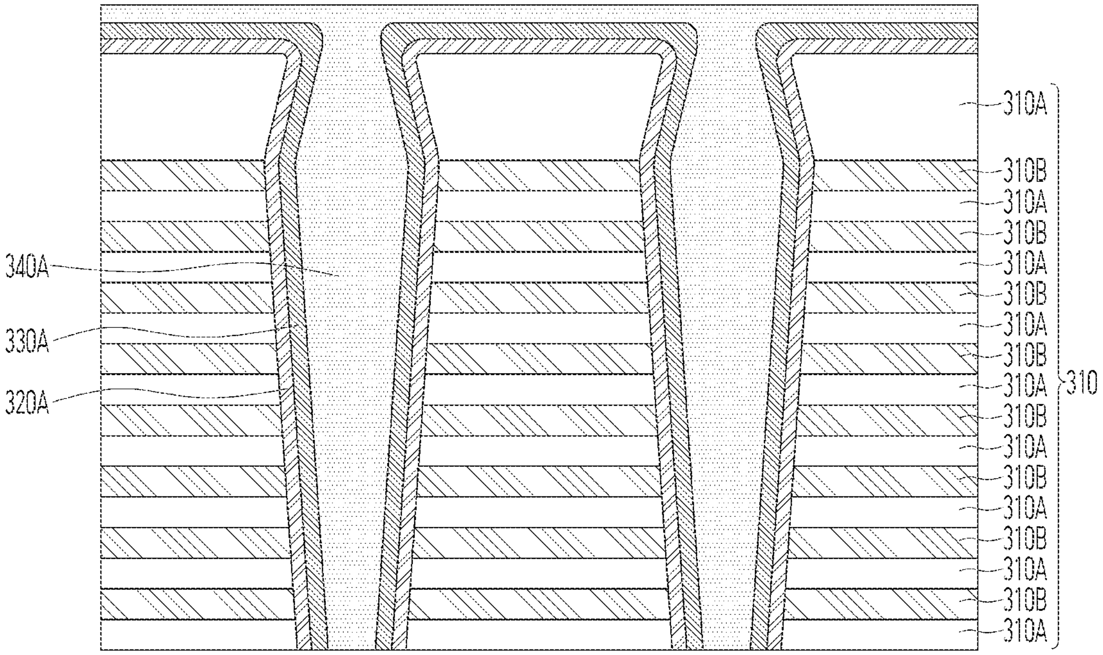

Referring to FIG. 3B, a preliminary memory layer 320A may be formed in the first opening OP1. The preliminary memory layer 320A may be formed conformally in the first opening OP1. For example, the preliminary memory layer 320A may be formed to fill only a portion of the first opening OP1 along a sidewall of the first opening OP1. The preliminary memory layer 320A may be formed by stacking a blocking layer, a data storage layer, and a tunneling layer. Here, the blocking layer or tunneling layer may include oxide or the like, and the data storage layer may include a floating gate, a nitride layer, a variable resistance layer, or the like.

Subsequently, a preliminary channel layer 330A may be formed in the first opening OP1. The preliminary channel layer 330A may be formed to fill only a portion of the first opening OP1 conformally along the sidewall of the first opening OP1. The preliminary channel layer 330A may include a semiconductor material such as polysilicon.

Subsequently, a preliminary insulating core 340A may be formed in the first opening OP1. The preliminary insulating core 340A may be formed to fill the first opening OP1. In a process of forming the preliminary insulating core 340A, the void V may be formed in the preliminary insulating core 340A. The preliminary insulating core 340A may include an insulating material such as oxide.

Figure 3C:
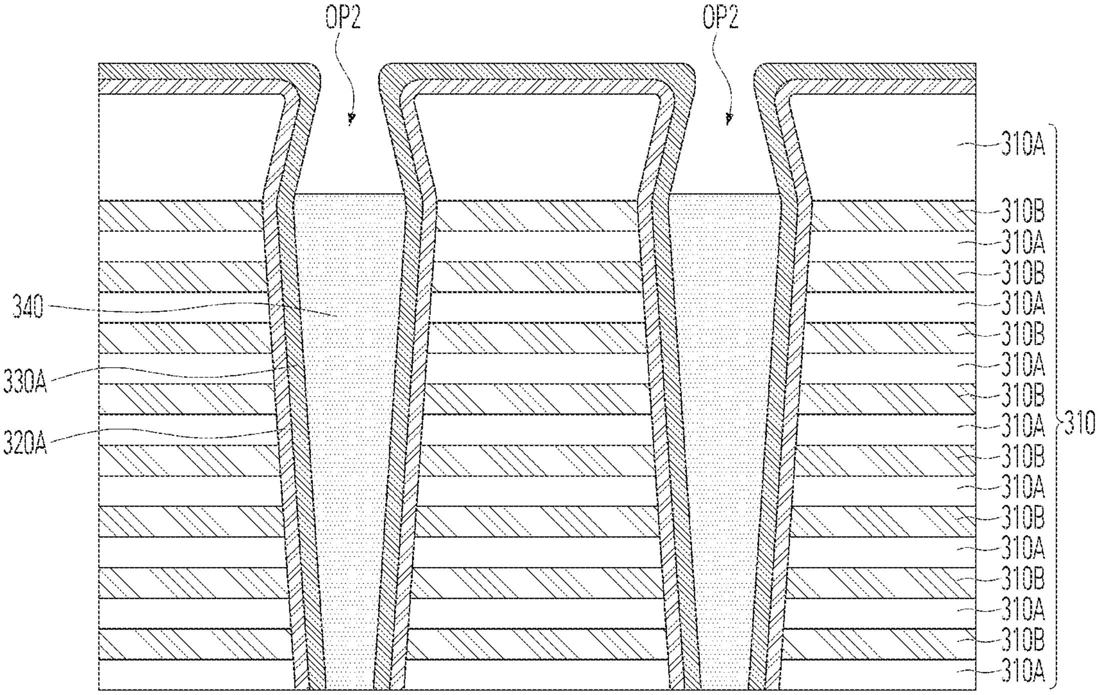

Referring to FIG. 3C, a second opening OP2 may be formed by etching the preliminary insulating core 340A. Here, the preliminary insulating core 340A may be etched to become an insulating core 340. The second opening OP2 may be formed considering that a drain region is to be formed. For example, the preliminary insulating core 340A may be etched so that a lower surface of the second opening OP2 is disposed at a level corresponding to a vicinity of a boundary between an uppermost first material layer 310A among the first material layers 310A and an uppermost second material layer 310B among the second material layers 310B.

Figure 3D:
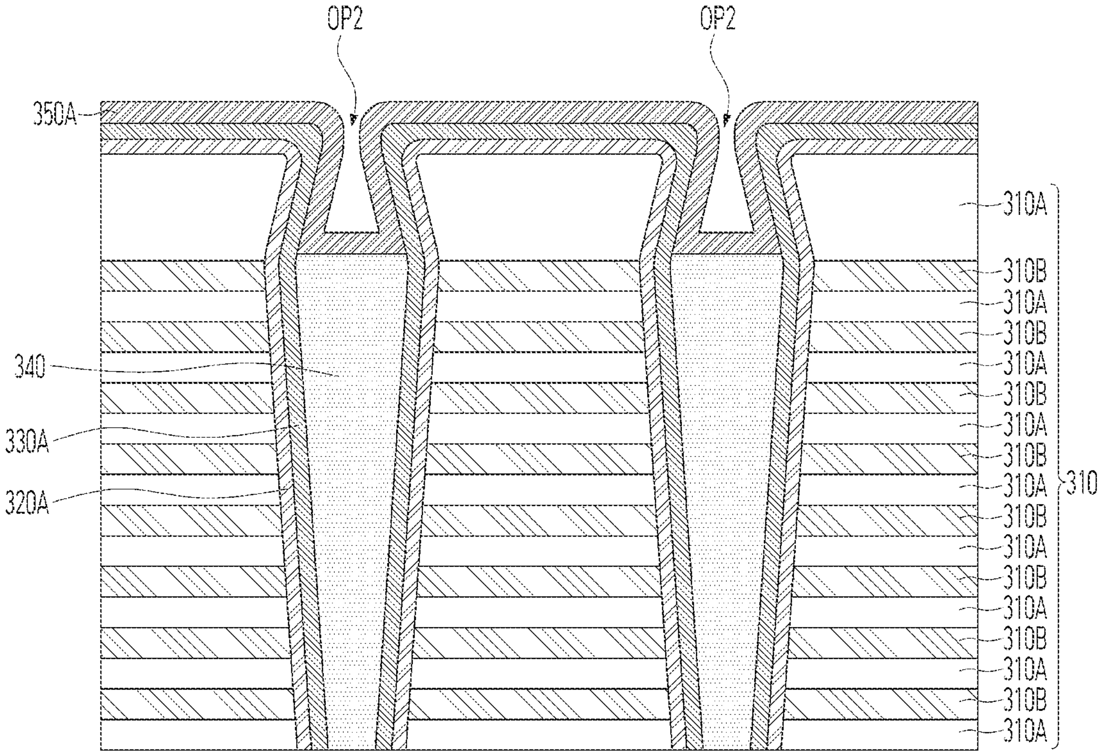

Referring to FIG. 3D, a preliminary capping liner 350A may be formed in the second opening OP2. The preliminary capping liner 350A may be conformally formed in the second opening OP2. The preliminary capping liner 350A may be formed to fill only a portion of the second opening OP2 along a sidewall of the second opening OP2 and an upper surface of the insulating core 340. Here, the second opening OP2 may maintain an open state. The preliminary capping liner 350A may include a semiconductor material such as polysilicon. The preliminary capping liner 350A may include an impurity of a first concentration. Here, the impurity may include phosphorus.

Figure 3E:
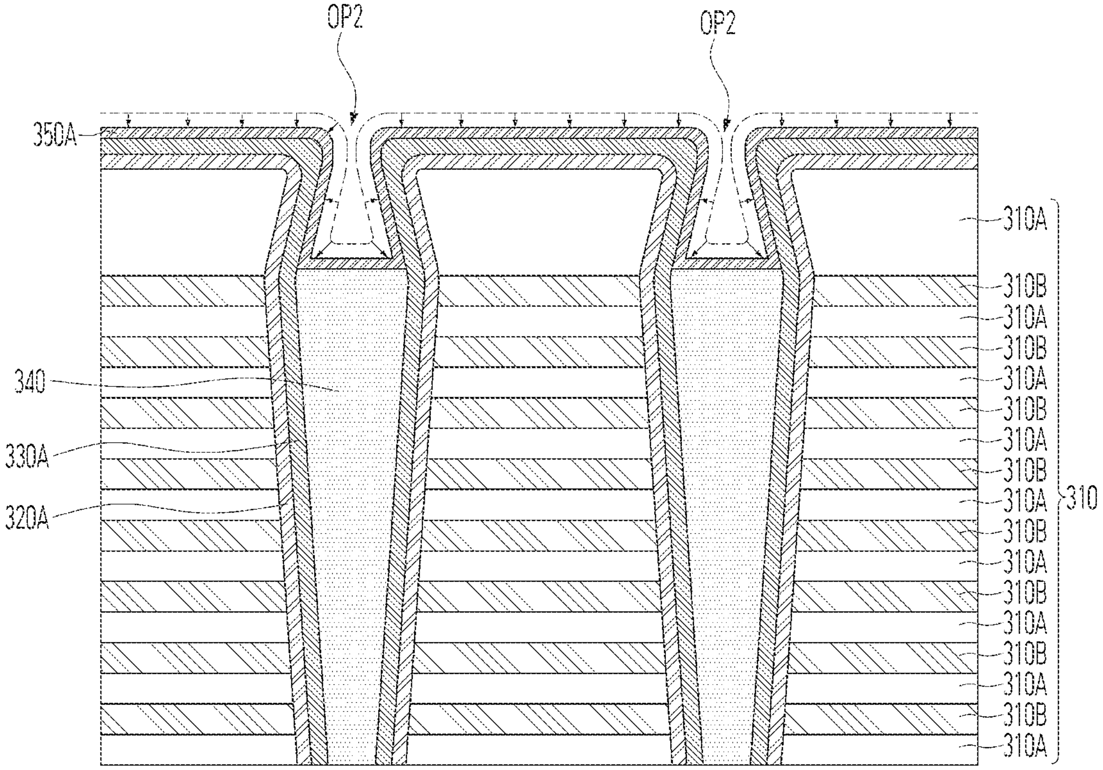

Referring to FIG. 3E, the preliminary capping liner 350A may be partially etched. For example, to remove an overhang formed in a process of forming the preliminary capping liner 350A in the second opening OP2, the preliminary capping liner 350A may be etched at a partial thickness. The preliminary capping liner 350A may maintain a state in which the preliminary capping liner 350A is conformally formed in the second opening OP2.

Figure 3F:
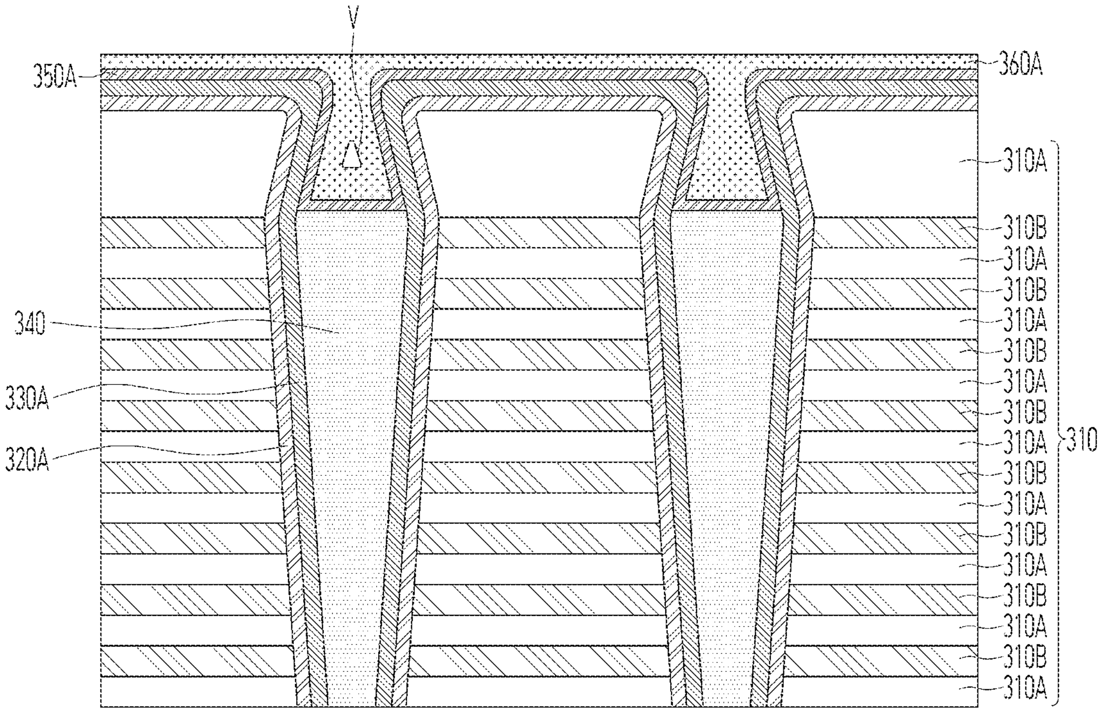

Referring to FIG. 3F, a preliminary capping pattern 360A may be formed in the second opening OP2. For example, the preliminary capping pattern 360A may be formed in the partially etched preliminary capping liner 350A. Here, the preliminary capping pattern 360A may be formed to fill the second opening OP2. Accordingly, a seam may be formed in the preliminary capping pattern 360A. In a subsequent process, the seam may be replaced with the void V. The preliminary capping pattern 360A may include a semiconductor material such as polysilicon.

The preliminary capping pattern 360A may be formed at a temperature relatively lower than that when forming the preliminary capping liner 350A. The preliminary capping pattern 360A may be deposited at 400 to 600 °C. For example, the preliminary capping pattern 360A may be deposited at 450 to 520 °C. When the preliminary capping pattern 360A is deposited at a relatively low temperature, a seed generation rate of the preliminary capping pattern 360A may decrease. Accordingly, a seam might not be formed. Therefore, the formation of the void V may be prevented or the size of the void V may be reduced substantially.

The preliminary capping pattern 360A may include an impurity of a concentration different from that of the preliminary capping liner 350A. For example, the preliminary capping liner 350A may include an impurity of a first concentration, and the preliminary capping pattern 360A may include an impurity of a second concentration less than the first concentration. Here, the impurity may include phosphorus. When forming the preliminary capping pattern 360A, in a case where a concentration of an impurity is great, roughness of a surface may increase and a seam may be formed. Therefore, according to an embodiment of the present disclosure, because the preliminary capping pattern 360A including an impurity of a relatively less concentration is formed, the formation of the void V may be prevented or the size of the void V may be reduced substantially.

In addition, the preliminary capping pattern 360A may be formed to fill the second opening OP2 while gradually reducing the concentration of the impurity. For example, the preliminary capping pattern 360A may begin to be formed at substantially the same concentration as that of the preliminary capping liner 350A and then gradually reduce the concentration of the impurity. Here, a time point at which the concentration of the impurity is gradually reduced is when 50 to 70% of a target thickness of the preliminary capping pattern 360A is formed. For example, the concentration of the impurity may be gradually reduced starting when 60% of the target thickness of the preliminary capping pattern 360A is formed. Even though the void V is formed in a process of forming the preliminary capping pattern 360A, the size of the void V may be reduced compared to a case where the preliminary capping pattern 360A including an impurity of a certain concentration is formed. Accordingly, the preliminary capping pattern 360A may include an impurity of a relatively low concentration in a vicinity of the void V and may include an impurity of a relatively great concentration as the preliminary capping pattern 360A is away from the void V.

The preliminary capping pattern 360A may include an impurity different from that of the preliminary capping liner 350A. For example, the preliminary capping liner 350A may include a first impurity, and the preliminary capping pattern 360A may include a second impurity different from the first impurity. Here, the first impurity may include phosphorus. The second impurity may include carbon. Accordingly, the preliminary capping pattern 360A may have a grain size less than that of the preliminary capping liner 350A, and thus roughness of a surface of the preliminary capping pattern 360A may be relatively small. Therefore, during a process of forming the preliminary capping pattern 360A, the formation of the void V may be prevented, or the size of the void V may be reduced substantially.

A process of forming the preliminary capping liner 350A, a process of partially etching the preliminary capping liner 350A, and a process of forming the preliminary capping pattern 360A may be performed in-situ. For reference, separate layers or interfaces formed through separate processes may not be identified in the preliminary capping liner 350A and the preliminary capping pattern 360A.

Figure 3G:
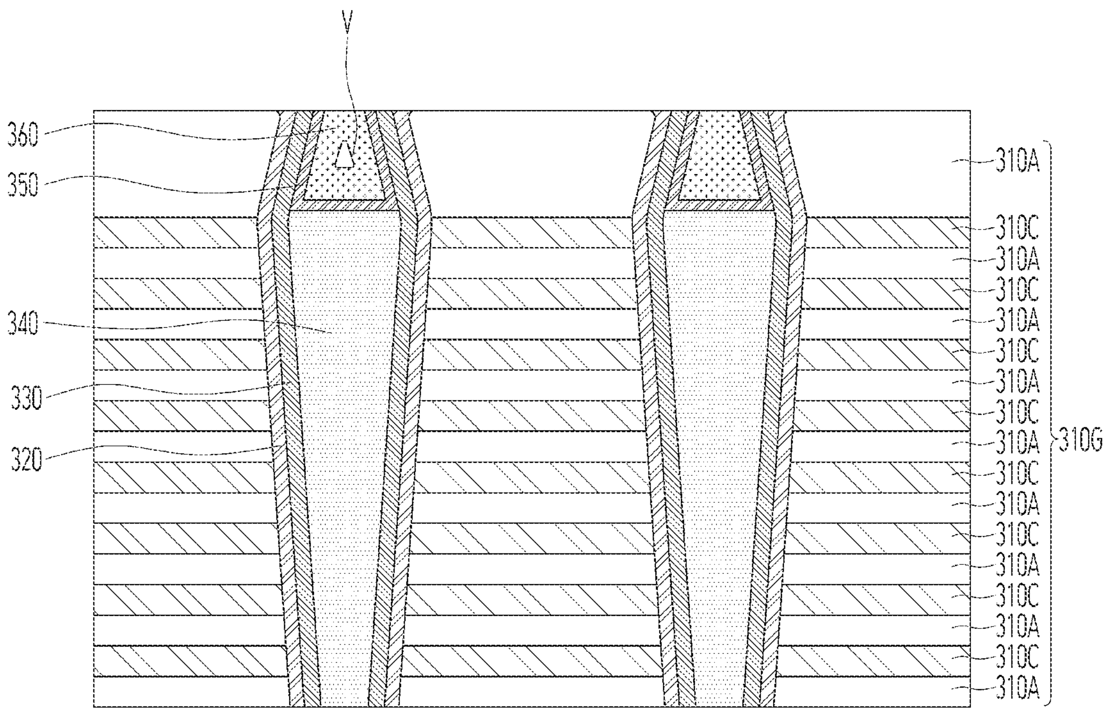

Referring to FIG. 3G, the preliminary capping pattern 360A, the preliminary capping liner 350A, the preliminary channel layer 330A, and the preliminary memory layer 320A formed on the stack 310 may be removed. For example, a capping pattern 360 may be formed by etching the preliminary capping pattern 360A. A capping liner 350 may be formed by etching the preliminary capping liner 350A. A channel layer 330 may be formed by etching the preliminary channel layer 330A. A memory layer 320 may be formed by etching the preliminary memory layer 320A. Subsequently, the capping pattern 360 and the capping liner 350 may be heat treated. When heat treating the capping pattern 360 and the capping liner 350, the seam formed in the capping pattern 360 may be replaced with the void V.

Subsequently, the second material layers 310B of the stack 310 may be replaced with third material layers 310C. The second material layers 310B may be removed through a slit (not shown) passing through the stack 310 and the third material layers 310C may be formed. Here, the third material layers 310C may include a conductive material such as tungsten. Accordingly, a gate structure 310G including the first material layers 310A and the third material layers 310C alternately stacked may be formed. When the second material layers 310B include a conductive material, a replacement process may be omitted. In this case, the stack 310 may be used as the gate structure 310G.

According to the manufacturing method described above, a process of forming the preliminary capping liner 350A, a process of partially etching the preliminary capping liner 350A, and a process of forming the preliminary capping pattern 360A may be performed in-situ.

In addition, the preliminary capping pattern 360A may be formed at a temperature relatively lower than that of the preliminary capping liner 350A. Alternatively, the preliminary capping pattern 360A including an impurity of a relatively less concentration compared to the preliminary capping liner 350A may be formed. Alternatively, the preliminary capping pattern 360A may be formed so that a concentration of a preliminary impurity gradually decreases. Alternatively, the preliminary capping pattern 360A including the impurity different from that of the preliminary capping liner 350A may be formed. Here, the preliminary capping pattern 360A may include carbon and have a relatively less grain size. Accordingly, the void V may be prevented from being formed in the preliminary capping pattern 360A.

FIGS. 4A to 4D are simplified schematic diagrams illustrating a method of manufacturing a semiconductor device according to an embodiment of the present disclosure. Hereinafter, content overlapping the content described above is omitted.

Figure 4A:
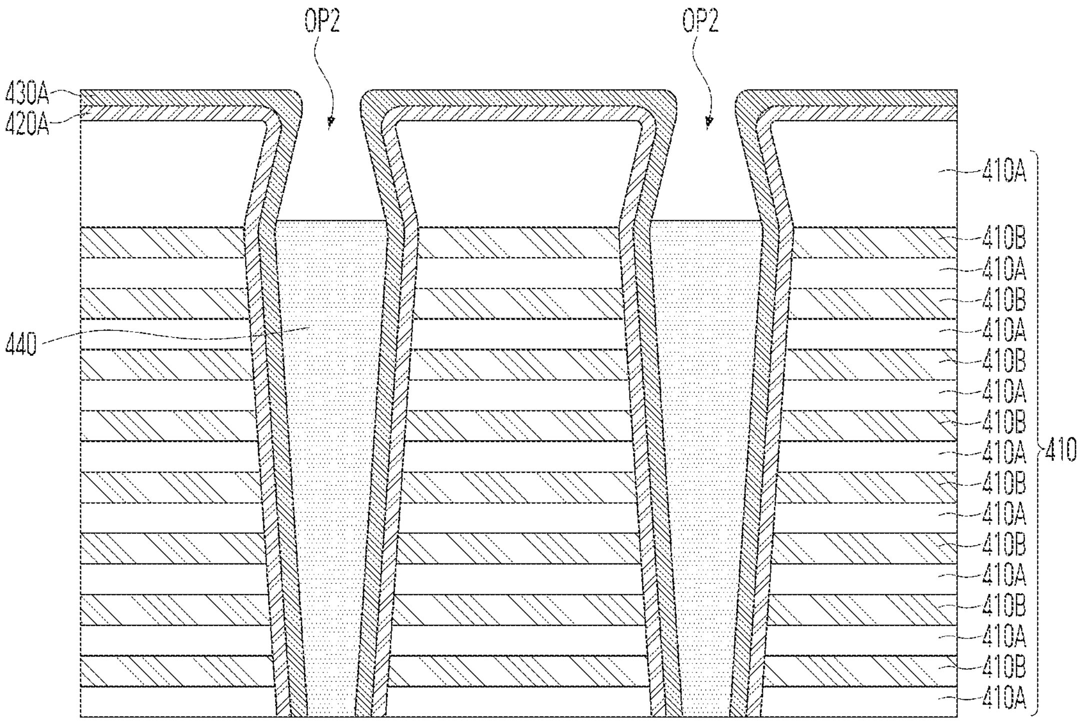
FIGS. 4A to 4D are simplified schematic diagrams illustrating a method of manufacturing a semiconductor device according to an embodiment of the present disclosure.

Referring to FIG. 4A, a stack 410 including first and second material layers 410A and 410B alternately stacked may be formed. Subsequently, a first opening may be formed in the stack 410. Subsequently, a preliminary memory layer 420A may be formed in the first opening. The preliminary memory layer 420A may be formed to fill only a portion of the first opening along a sidewall of the first opening. Subsequently, a preliminary channel layer 330A may be formed in the first opening. The preliminary channel layer 330A may be formed to fill only a portion of the first opening along the sidewall of the first opening. Subsequently, a preliminary insulating core may be formed in the first opening. The preliminary insulating core may be formed so that the first opening is filled. Subsequently, a second opening OP2 may be formed by etching the preliminary insulating core. The preliminary insulating core may be etched to become an insulating core 440.

Figure 4B:
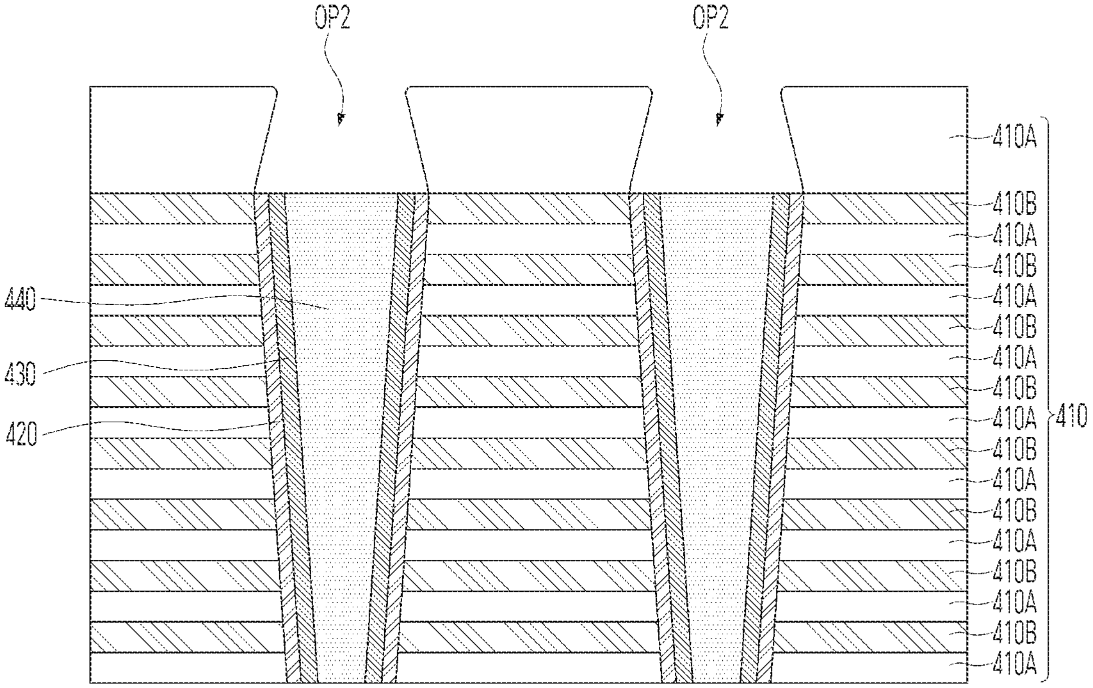

Referring to FIG. 4B, the second opening OP2 may be expanded by removing a portion of the preliminary channel layer 430A. For example, the preliminary channel layer 430A may be partially removed using chlorine gas ($Cl_2$gas) at 300 to 500 °C. Here, a portion of the preliminary memory layer 420A may also be removed simultaneously. The preliminary channel layer 430A and the preliminary memory layer 420A may be removed by a level corresponding to an upper surface of the insulating core 440. The preliminary channel layer 430A may be partially removed to become a channel layer 430, and the preliminary memory layer 420A may be partially removed to become a memory layer 420.

Figure 4C:
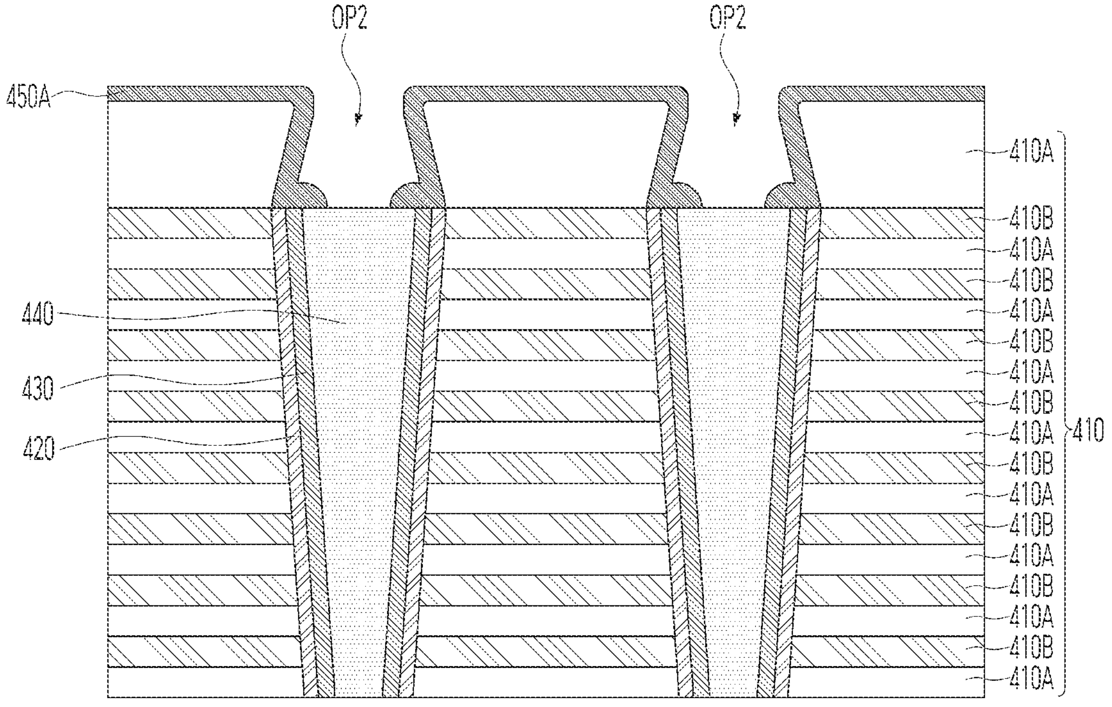
Figure 4D:
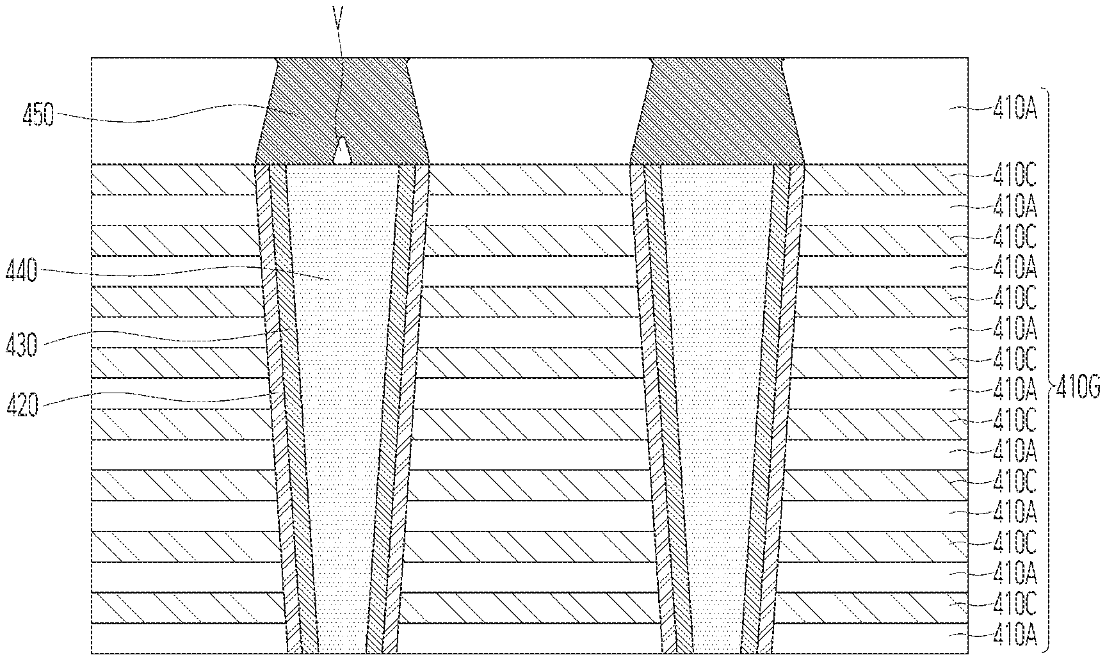

Referring to FIGS. 4C and 4D, a preliminary capping layer 450A may be formed in the second opening OP2. The preliminary capping layer 450A may be formed along an inner surface of the second opening OP2. The preliminary capping layer 450A may be formed on at least one of the first material layers 410A exposed by the second opening OP2, at least one of the second material layers 410B, the channel layer 430, or the insulating core 440. For example, the preliminary capping layer 450A may be formed on an uppermost first material layer 410A among the first material layers 410A and the channel layer 430. Here, the preliminary capping layer 450A may include amorphous silicon or polysilicon.

The preliminary capping layer 450A may be formed by an epitaxial method or a deposition method. For example, the preliminary capping layer 450A may include an epitaxial pattern formed by epitaxial-growing amorphous silicon from the channel layer 430 using the epitaxial method. In addition, the preliminary capping layer 450A may include a deposition pattern formed by depositing amorphous silicon on the uppermost first material layer 410A using the deposition method. Accordingly, amorphous silicon may be epitaxial-grown from the channel layer 430 to fill the second opening OP2 from a lower surface. As the source gas, at least one of DCS gas, $SiH_4$ gas, and $PH_3$ gas may be used. For example, DCS gas and $SiH_4$ gas may be injected at a 1:1 ratio. Here, $PH_3$ gas may be injected together with DCS gas and $SiH_4$ gas as a source gas for impurity doping. The epitaxial pattern and the deposition pattern may be one layer or separate layers formed through separate processes. Accordingly, an interface may exist or may not exist in the epitaxial pattern and the deposition pattern.

The preliminary capping layer 450A may be formed to fill the second opening OP2. Accordingly, the void V may be formed in the preliminary capping layer 450A. A speed of forming the epitaxial pattern through the epitaxial method may be higher than a speed of forming the deposition pattern through the deposition method. According to an embodiment of the present disclosure, the preliminary capping layer 450A may be formed at a relatively low temperature. For example, the preliminary capping layer 450A may be formed at a temperature of 450 to 520 °C. When forming the preliminary capping layer 450A at a relatively low temperature, the speed of forming the epitaxial pattern may be higher than the speed of forming the deposition pattern. This is because energy required for forming the epitaxial pattern may be relatively less than that of forming the deposition pattern, and sufficient energy may be transferred even at a relatively low temperature. The preliminary capping layer 450A may be filled from a lower surface of the second opening OP2 relatively quickly and may be filled from a sidewall of the second opening OP2 relatively slowly. Accordingly, even though the void V is formed, the void V may be disposed on the lower surface of the second opening OP2. Here, the void V may expose the insulating core 440.

Subsequently, a capping layer 450 may be formed by etching the preliminary capping layer 450A. Subsequently, the capping layer 450 may be heat treated. Here, amorphous silicon in the capping layer 450 may be replaced with polysilicon. Subsequently, a gate structure 410G may be formed by replacing the second material layers 410B with third material layers 410C through a slit (not shown) passing through the stack 410.

According to the manufacturing method described above, the capping layer 450 may be formed using an epitaxial method. Accordingly, even though the void V is formed, the void V may be disposed on the lower surface of the second opening OP2. Therefore, a conductive material may be prevented or reduced from flowing through the void V in a subsequent process.

Although embodiments according to the technical concepts of the present disclosure have been described with reference to the accompanying drawings, this is only for describing an embodiment according to the concept of the present disclosure, and the embodiments are not limited to the above-described embodiments. Within the scope of the technical concepts of the present disclosure described in the claims, various forms of substitution, modification, and changes will be possible by those skilled in the art to which the present disclosure belongs, and these also belong to the scope of the present disclosure. Furthermore, the embodiments may be combined to form additional embodiments.

What is claimed is:

1. A method of manufacturing a semiconductor device, the method comprising:

forming a stack including first material layers and second material layers alternately stacked;

forming a first opening in the stack;

forming a preliminary channel layer in the first opening;

forming a preliminary insulating core in the preliminary channel layer;

forming a second opening by etching the preliminary insulating core;

forming a preliminary capping liner in the second opening;

partially etching the preliminary capping liner; and forming a preliminary capping pattern including an impurity of a concentration different from that of the preliminary capping liner, in the second opening.

2. The method of claim 1, wherein forming the preliminary capping liner, partially etching the preliminary capping liner, and forming the preliminary capping pattern are performed in-situ.

3. The method of claim 1, wherein the preliminary capping liner includes the impurity of a first concentration, and the preliminary capping pattern includes the impurity of a second concentration less than the first concentration.

4. The method of claim 3, wherein the impurity includes phosphorus.

5. The method of claim 1, wherein forming the preliminary capping pattern comprises depositing the preliminary capping pattern at 400 to 600 °C.

6. The method of claim 1, wherein the preliminary capping pattern is formed while gradually reducing a concentration of the impurity.

7. The method of claim 1, wherein a void is formed in the preliminary capping pattern when forming the preliminary capping pattern.

8. The method of claim 1, wherein the preliminary capping liner includes a first impurity, and the preliminary capping pattern includes a second impurity different from the first impurity.

9. The method of claim 8, wherein the first impurity includes phosphorus and the second impurity includes carbon.

10. The method of claim 1, wherein the preliminary capping pattern has a grain size less than that of the preliminary capping liner.

11. The method of claim 10, wherein the capping liner has a first grain size, and the capping pattern has a second grain size less than the first grain size.

12. The method of claim 1, further comprising:

forming a capping pattern by etching the preliminary capping pattern;

forming a capping liner by etching the preliminary capping liner; and heat treating the capping pattern and the capping liner.

13. The method of claim 12, further comprising:

forming a channel layer by etching the preliminary channel layer.

* * * * *